(12) United States Patent
Matsuda et al.

(10) Patent No.: US 8,663,493 B2
(45) Date of Patent: Mar. 4, 2014

(54) PIEZOELECTRIC MATERIAL AND PRODUCTION METHOD THEREFOR

(75) Inventors: Takanori Matsuda, Chofu (JP);
Takayuki Watanabe, Kawasaki (JP);
Hiroshi Saito, Yokohama (JP);
Nobuhiro Kumada, Kofu (JP)

(73) Assignees: Canon Kabushiki Kaisha, Tokyo (JP);
University of Yamanashi, Kofu-shi (JP)

( * ) Notice: Subject to any disclaimer, the term of this patent is extended or adjusted under 35 U.S.C. 154(b) by 242 days.

(21) Appl. No.: 13/202,240

(22) PCT Filed: Apr. 20, 2010

(86) PCT No.: PCT/JP2010/057319
§ 371 (c)(1),
(2), (4) Date: Aug. 18, 2011

(87) PCT Pub. No.: WO2010/125987
PCT Pub. Date: Nov. 4, 2010

(65) Prior Publication Data
US 2011/0297870 A1 Dec. 8, 2011

(30) Foreign Application Priority Data

Apr. 27, 2009 (JP) ................. 2009-108378

(51) Int. Cl.
*C04B 35/495* (2006.01)
*H01L 41/187* (2006.01)
*H01L 41/24* (2011.01)

(52) U.S. Cl.
USPC ...... 252/62.9 R; 501/135; 264/428; 264/437; 427/547; 427/598; 427/100; 427/129; 427/128

(58) Field of Classification Search
USPC .............. 252/62.9 R; 501/135; 264/428, 437; 427/547, 598, 100, 129, 128
See application file for complete search history.

(56) References Cited

U.S. PATENT DOCUMENTS 6,692,652 B2  2/2004  Takao et al.
7,560,089 B2  7/2009  Takao et al.
(Continued)

FOREIGN PATENT DOCUMENTS

CN   1358326 A   7/2002
CN   1812128 A   8/2006
(Continued)

OTHER PUBLICATIONS

John R. Oliver et al., "Ferroelectric Properties of Tungsten Bronze Morphotropic Phase Boundary Systems," 72(2) J. Am. Ceram. Soc. 202-211 (1989) (XP 002594221).

(Continued)

*Primary Examiner* — Carol M Koslow
(74) *Attorney, Agent, or Firm* — Fitzpatrick, Cella, Harper & Scinto

(57) ABSTRACT

Provided is an oriented piezoelectric material with satisfactory sintering property free of Pb that is a hazardous substance, and a water-soluble alkaline ion, and a production method therefor. To this end, provided is a compound, including a tungsten bronze structure metal oxide, in which: the tungsten bronze structure metal oxide contains at least metal elements of Ba, Bi, Ca, and Nb, the metal elements satisfying the following conditions in terms of molar ratio; and has a C-axis orientation. The compound shows Ba/Nb=a: $0.363<a<0.399$, Bi/Nb=b: $0.0110<b<0.0650$, and Ca/Nb=c: $0.005<c<0.105$. The tungsten bronze structure metal oxide preferably includes $(1-x) \cdot Ca_{1.4}Ba_{3.6}Nb_{10}O_{30} - x \cdot Ba_4Bi_{0.67}Nb_{10}O_{30}$ ($0.30 \leq x \leq 0.95$).

9 Claims, 3 Drawing Sheets

(56) References Cited

U.S. PATENT DOCUMENTS

| | | |
|---|---|---|
| 2006/0118844 A1 | 6/2006 | Kijima et al. |
| 2007/0161497 A1 | 7/2007 | Ogiso |
| 2010/0025618 A1* | 2/2010 | Watanabe et al. ........ 252/62.9 R |
| 2011/0193451 A1 | 8/2011 | Watanabe et al. |
| 2013/0076204 A1* | 3/2013 | Matsuda et al. .............. 310/311 |
| 2013/0088120 A1* | 4/2013 | Hayashi et al. .............. 310/311 |

FOREIGN PATENT DOCUMENTS

| | | |
|---|---|---|
| EP | 1 642 875 A2 | 4/2006 |
| JP | 10-158016 A | 6/1998 |
| JP | 2006-264316 A | 10/2006 |
| JP | 4135389 B | 8/2008 |
| WO | 00/77832 A2 | 12/2000 |

OTHER PUBLICATIONS

Office Action in Korean Application No. 10-2011-7027599 (dated Apr. 29, 2013).

Office Action in Chinese Application No. 201080018175.5 (dated Jul. 23, 2013).

Fang Liang et al., "Structural and Dielectric Properties of a Niobate $Ba_3NaBiNb_{10}O_{30}$," 17(5) Acta Phys. Chim Sin. 457-459 (2001).

* cited by examiner

PIEZOELECTRIC MATERIAL AND PRODUCTION METHOD THEREFOR

TECHNICAL FIELD

The present invention relates to a piezoelectric material and a production method therefor, and more particularly, to a piezoelectric material formed of an oriented tungsten bronze structure metal oxide and a production method therefor.

BACKGROUND ART

A piezoelectric device converts electric energy into mechanical energy such as mechanical displacement, stress, or vibration, or converts mechanical energy into electric energy, and is applied to an ultrasonic motor, an ink jet head, or the like.

Hitherto, a piezoelectric material containing lead as a main component, typified by lead zirconate titanate ($Pb(Ti_xZr_{1-x})O_3$), has been widely used for the piezoelectric device. In contrast, it has been reported that piezoelectric characteristics were enhanced by including an alkaline metal in a piezoelectric material, as a representative of a lead-free piezoelectric material (Japanese Patent No. 4,135,389). However, the inclusion of an alkaline metal causes a problem in its practical use, because there is a limit to use environment thereof due to hygroscopicity and the like. Furthermore, in a tungsten bronze structure metal oxide, an attempt has been made to control the orientation for the purpose of enhancing its function (Japanese Patent Application Laid-Open No. 2006-264316).

A conventional piezoelectric material mainly contains lead, and it is expected that the piezoelectric material contain no lead from the viewpoint of environmental load. Meanwhile, it has been reported that piezoelectric characteristics were enhanced with an alkaline metal-containing oxide piezoelectric material containing no lead. However, in a piezoelectric material containing an alkaline metal, compounds of Na and K that are raw materials are water-soluble. Therefore, there is a problem in terms of industrial production that simple steps of mixing raw materials in water, and thereafter, drying a mixed slurry cannot be adopted. Furthermore, there is a fear in that Na ions and K ions in a crystal are segregated at the grain boundary and the interface with electrodes due to migration during the use for a long period of time, and the piezoelectric material may absorb moisture. Thus, when a device is produced from such material, it is considered to be difficult to put the device into a practical use because the device exhibits poor stability and durability.

Furthermore, a lead-fee, alkali-free tungsten bronze structure metal oxide has such a feature that the shape anisotropy is large and a polarization axis direction is a C-axis direction that is a short direction of a unit cell of a crystal. Therefore, it is considered that a lead-fee tungsten bronze structure metal oxide can only have a 180° domain. Therefore, in a lead-fee, alkali-free tungsten bronze structure metal oxide having a random orientation formed by an ordinary production method for ceramics, the number of effective domains which may contribute to piezoelectric characteristics is small, and a large piezoelectric constant cannot be obtained.

SUMMARY OF THE INVENTION

The present invention has been accomplished in view of the above-mentioned circumstances. An object of the present invention is to provide a novel compound, an oriented piezoelectric material with satisfactory sintering property which is free from Pb that is a hazardous substance and is free from a water-soluble alkaline ion, and a production method therefor.

A compound for solving the above-mentioned problem is a compound including a tungsten bronze structure metal oxide, in which the tungsten bronze structure metal oxide contains at least metal elements of Ba, Bi, Ca, and Nb, the metal elements satisfying the following conditions in terms of molar ratio; and has a C-axis orientation: Ba/Nb=a: $0.363<a<0.399$; Bi/Nb=b: $0.0110<b<0.0650$; and Ca/Nb=c: $0.005<c<0.105$.

It should be noted that the molar ratio of metal elements refers to a weight ratio of each metal element measured and calculated by a fluorescent X-ray apparatus expressed as an atomic percentage (at. %). For example, in the case where an obtained compound is $Ca_{1.4}Ba_{3.6}Nb_{10}O_{30}$, Ba/Nb is 0.14 in terms of molar ratio of metal elements.

Furthermore, a piezoelectric material for solving the above-mentioned problems includes the above-mentioned compound.

Furthermore, a production method for a compound for solving the above-mentioned problems is a production method for a compound including: the step (A) of providing a slurry in which powder of a tungsten bronze structure metal oxide obtained by forming a solid solution of at least metal elements of Ba, Bi, Ca, and Nb is dispersed; the step (B) of providing a molded body by placing the slurry on a base, orienting the slurry by subjecting the slurry to rotational magnetic field treatment, and then drying the slurry; and the step (C) of sintering the molded body.

In addition, in the production method for a compound, the surface of the base in the step (B) of providing a molded body has an undercoat layer formed of a tungsten bronze structure metal oxide obtained by forming a solid solution of at least metal elements of Ba, Bi, Ca, and Nb.

In addition, in the production method for a compound, the surface of the base in the step (B) of providing a molded body has an undercoat layer formed of a tungsten bronze structure metal oxide obtained by forming a solid solution of at least metal elements of Ba, Bi, Ca, Nb, and Mn.

In addition, in the production method for a compound, the undercoat layer is oriented.

According to the present invention, there can be provided a highly oriented piezoelectric material with satisfactory sintering property which is free from Pb that is a hazardous substance and is free from a water-soluble alkaline ion, and a production method therefor.

In particular, a compound formed of a tungsten bronze structure metal oxide of the present invention is oriented in a particular direction. Therefore, the ratio of a domain contributing to polarization increases to enable sufficient polarization treatment, whereby a piezoelectric material having large piezoelectric characteristics can be obtained.

Furthermore, a piezoelectric material formed of a compound of the present invention can be used for various other purposes such as a capacitor material, an ultrasonic motor, and an ink jet head.

Further features of the present invention will become apparent from the following description of exemplary embodiments with reference to the attached drawings.

PREFERRED MODE FOR CARRYING OUT THE INVENTION

Hereinafter, an embodiment of the present invention is described in detail. A description is made using a piezoelectric material as a compound of the present invention; however, the compound of the present invention may be used for other applications such as a capacitor material. The compound of the present invention is used preferably as a piezoelectric material. However, the compound of the present invention is not used only as the piezoelectric material.

The compound according to the present invention is a compound including a tungsten bronze structure metal oxide, in which the tungsten bronze structure metal oxide contains at least metal elements of Ba, Bi, Ca, and Nb, the metal elements satisfying the following conditions in terms of molar ratio; and has a C-axis orientation: Ba/Nb=a: 0.363<a<0.399; Bi/Nb=b: 0.0110<b<0.0650; and Ca/Nb=c: 0.005<c<0.105. More preferred ranges of a, b, and c are Ba/Nb=a: 0.373<a<0.387; Bi/Nb=b: 0.0390<b<0.0600; and Ca/Nb=c: 0.0140<c<0.0700. Here, the direction of a polarization axis of the tungsten bronze structure metal oxide is a C-axis direction.

Furthermore, the piezoelectric material according to the present invention includes the above-mentioned compound.

Furthermore, a production method of the compound according to the present invention includes providing powder of a tungsten bronze structure metal oxide in which a solid solution of metal elements of at least Ba, Bi, Ca, and Nb is formed, providing a slurry in which the powder of a tungsten bronze structure metal oxide is dispersed; subjecting the slurry to rotational magnetic field treatment to orient the slurry, and drying and sintering the oriented slurry.

In the piezoelectric material according to the present invention, the tungsten bronze structure metal oxide preferably includes $(1-x) \cdot Ca_{1.4}Ba_{3.6}Nb_{10}O_{30}-x \cdot Ba_4Bi_{0.67}Nb_{10}O_{30}$ (0.30≤x≤0.95).

Hereinafter, $Ca_{1.4}Ba_{3.6}Nb_{10}O_{30}$ is represented as CBN, and $Ba_4Bi_{0.67}Nb_{10}O_{30}$ is represented as BBN.

Furthermore, the piezoelectric material according to the present invention includes the tungsten bronze structure metal oxide. However, the piezoelectric material may contain impurities to such a degree as not to impair effects of the present invention. Examples of the impurities include Sr, Mg, Si, Zr, Al, Ta, Ti, V, and Y.

Figure 3A:
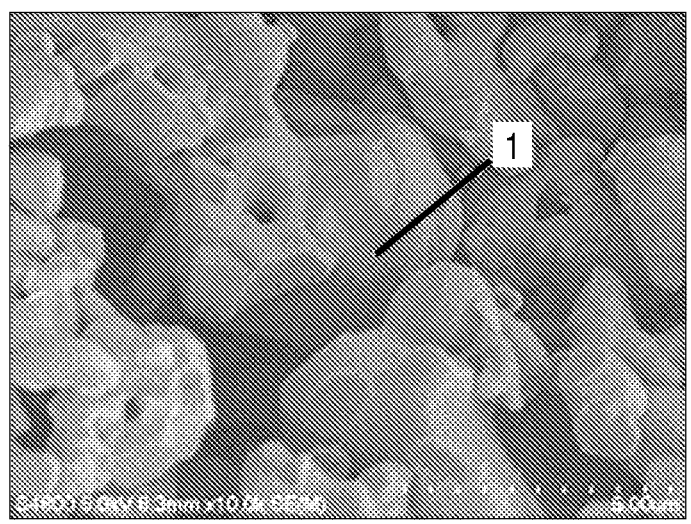
FIGS. 3A, 3B and 3C are SEM images of tungsten bronze structure metal oxide powder for a slurry.
Figure 3B:
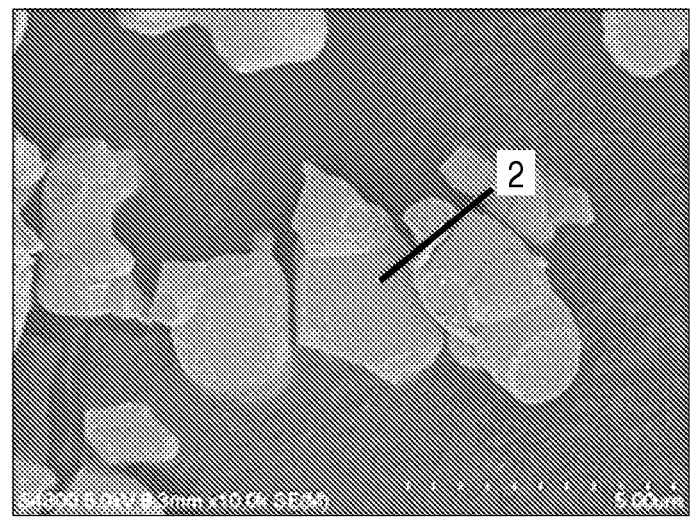
Figure 3C:
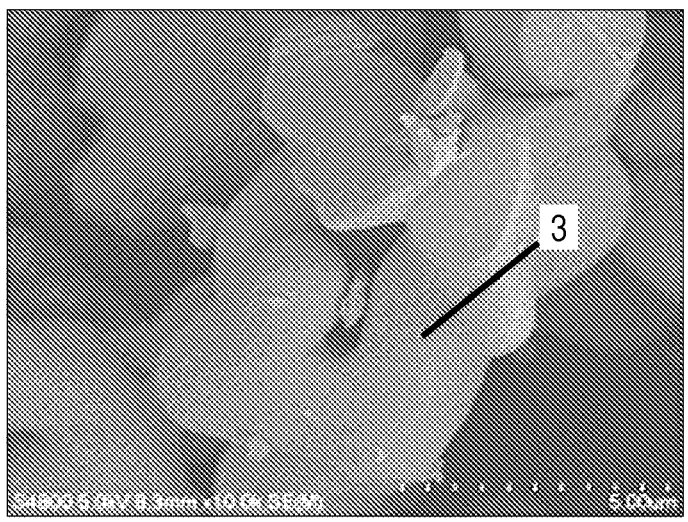

FIGS. 3A to 3C are SEM images of powder of a tungsten bronze structure metal oxide for a slurry. FIG. 3A is an SEM image of CBN powder for a slurry 1, illustrating a particle shape of synthetic powder before the preparation of a slurry of CBN, in which x=0. Furthermore, FIG. 3B is an SEM image of 0.55CBN–0.45BBN powder for a slurry 2, illustrating a particle shape of synthetic powder before the preparation of a slurry of 0.55CBN–0.45BBN, in which x=0.45. Furthermore, FIG. 3C is an SEM image of BBN powder for a slurry 3, illustrating a particle shape of synthetic powder before the preparation of a slurry of BBN, in which x=1.0.

It can be seen from FIG. 3A that CBN particles form an aggregate of particles with a chamfered shape of a size of 5 μm or more and particles of about 1 μm. Furthermore, in FIG. 3C, the growth of a neck is found remarkably in BBN particles and the BBN particles have a size of 5 μm or more. In contrast, It can be seen that 0.55CBN–0.45BBN in FIG. 3B have a particle size of about 3 μm and a particle diameter is reduced by forming a solid solution. From those results, it is considered that the dispersed state and flowability of particles have a large influence on an orientation in the later step, i.e., the step of magnetic field treatment with respect to dispersed particles. Therefore, the dispersed state of 0.55CBN–0.45BBN that has a small particle diameter is satisfactory and is likely to flow, and hence, it is expected that 0.55CBN–0.45BBN is likely to be influenced by the function of a magnetic field.

Furthermore, the piezoelectric material of the present invention has such a feature that the tungsten bronze structure metal oxide has a Lotgering factor F, which indicates the orientation degree with respect to a (001) plane which means the orientation degree of a C-axis in an X-ray diffraction method, of 0.30 or more and 1.00 or less, preferably 0.35 or more and 0.80 or less.

The Lotgering factor F, which indicates the orientation degree of an oxide with respect to a particular plane direction is calculated by Equation 1, using the integrated peak intensity of an X-ray diffracted from a targeted crystal plane.

$$F=(\rho-\rho_0)/(1-\rho_0) \quad \text{(Equation 1)}$$

Here, $\rho_0$ is calculated using a diffraction intensity ($I_0$) of an X-ray of a non-oriented sample, and in the case of a C-axis orientation, $\rho_0$ is obtained from Equation 2 as a ratio of a total of diffraction intensities of (001) planes (all the planes perpendicular to a C-axis) with respect to the sum of all the diffraction intensities.

$$\rho_0=\Sigma I_0(001)/\Sigma I_0(hkl) \quad \text{(Equation 2)}$$

Here, $\rho$ is calculated using a diffraction intensity (I) of an X-ray of an oriented sample, and in the case of a C-axis orientation, $\rho$ is obtained from Equation 3 in the same way as in Equation 2 above, as a ratio of a total of diffraction intensities of (001) planes with respect to the sum of all the diffraction intensities.

$$\rho=\Sigma I(001)/\Sigma I(hkl) \quad \text{(Equation 3)}$$

Here, the mechanism of a C-axis orientation by a rotational magnetic field can be described by a structure in which a unit cell of a crystal of the tungsten bronze structure metal oxide has an A-axis and a B-axis longer than the C-axis. The magnetic sensitivity of a crystal of a tungsten bronze structure metal oxide of a non-magnetic material increases in a direction in which a crystal axis is long. Therefore, when a magnetic field is simply applied to a slurry placed still, the A-axis and B-axis directions of the crystal of the tungsten bronze structure metal oxide are aligned parallel to a magnetic field direction. Here, the A-axis and B-axis directions are oriented in a circumferential direction with respect to the direction orthogonal to the magnetic field direction by rotating a magnetic field. Therefore, the C-axis direction that is a component substantially orthogonal to the A-axis and B-axis directions is aligned in one direction. Due to the above-mentioned mechanism, when a rotational magnetic field is applied to the crystal of the tungsten bronze structure metal oxide, it is expected that the C-axis of the crystal of the tungsten bronze structure metal oxide is aligned in the direction orthogonal to the magnetic field direction.

Figure 4:
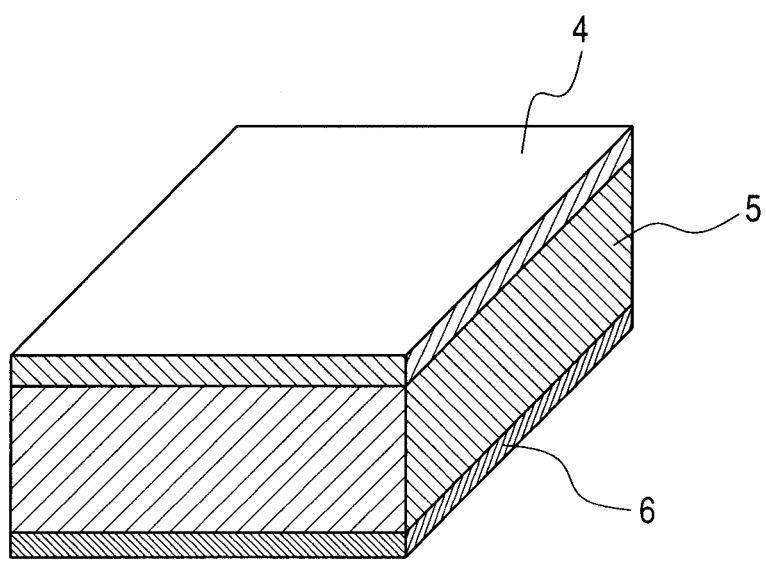
FIG. 4 is a schematic view of a piezoelectric device.

FIG. 4 is a schematic view illustrating an example of a piezoelectric device using the piezoelectric material of the present invention. The piezoelectric device has at least a first electrode 4, a piezoelectric ceramic 5 formed of the piezoelectric material of the present invention, and a second electrode 6.

The first electrode and second electrode are formed of a conductive layer having a thickness of about 5 to 2000 nm. The material therefor is not particularly limited, and may be one that is generally used in piezoelectric devices. Examples of the material include metals such as Ti, Pt, Ta, Ir, Sr, In, Sn, Au, Al, Fe, Cr, Ni, Pd, and Ag, and oxides thereof. The first and second electrodes may be formed of one kind of them or a laminate of two or more kinds of them. The first and second electrodes may be formed of materials different from each other.

There is no limit to a method of producing the first and second electrodes, and the electrodes may be formed by baking a metal paste or may be formed by sputtering, vapor deposition, or the like. Furthermore, the first and second electrodes may be patterned to desired shapes.

EXAMPLES

Hereinafter, the piezoelectric material of the present invention is described specifically. However, the present invention is not limited thereto.

Example 1

A piezoelectric material of a tungsten bronze structure metal oxide $(1-x)CBN-xBBN$ ($0 \leq x \leq 1$), in which $x=0.30$, was produced. As materials, barium carbonate, calcium carbonate, bismuth oxide, and niobium oxide powders were used, and dry mixed with a mortar in a predetermined mixing ratio.

Calcination was performed by placing the mixed powder in an aluminum crucible and sintering it using an electric furnace in the atmosphere at 950° C. for 5 hours. Then, the mixed powder was crushed with a mortar and placed again in the alumina crucible, and sintered using the electric furnace in the atmosphere at 1100° C. for 5 hours.

A slurry was prepared by mixing the powder obtained by the calcination, pure water, and a dispersant in the predetermined amount is 2.0% by weight, and subjecting the mixture to dispersion treatment using a pot mill for 24 hours or longer.

For magnetic field treatment, a superconducting magnet (JMTD-10T180 produced by Japan Superconductor Technology, Inc.) was used. A magnetic field of 10 T was generated by the superconducting magnet, and a table was placed so that a rotation shaft was perpendicular to the magnetic field direction and rotated at 30 rpm using a non-magnetic ultrasonic motor capable of rotation driving in a magnetic field. Plaster was placed still on the table, and a slurry was flowed into the plaster on the table during rotation, whereby the slurry was molded by slip casting. In the description of the present application, the treatment of achieving a particular orientation by rotating a slurry with respect to an applied magnetic field may be called rotational magnetic field treatment.

The molded body thus obtained was sintered using the electric furnace in the atmosphere at 1300° C. to 1350° C. for 6 hours. Here, the density of the obtained sintered body was evaluated by the Archimedes' method. Furthermore, the obtained sintered body was subjected to structure analysis by XRD (X-ray diffraction) and composition analysis by fluorescent X-ray analysis after the surface was cut.

Figure 1:
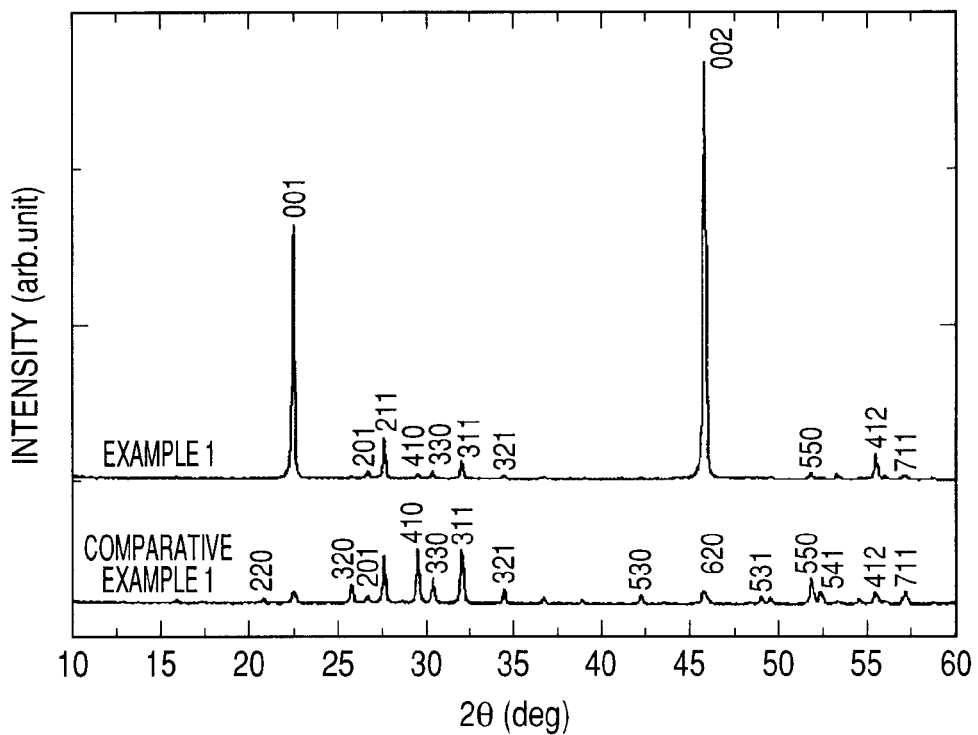
FIG. 1 is an x-ray diffraction (XRD) diagram of θ-2θ measurement in Example 1 of the present invention and Comparative Example 1.

FIG. 1 illustrates results of the X-ray diffraction (XRD) of θ-2θ measurement. The upper side of FIG. 1 illustrates a profile of Example 1 ($x=0.30$) and the lower side of FIG. 1 illustrates a profile of Comparative Example 1 ($x=0$). It was found from the results that both the profiles showed tungsten bronze structure oxides. Furthermore, it was found that the peak intensity attributed to (001) was large in Example 1 in which the rotational magnetic field treatment was conducted, and a C-axis orientation was achieved. Based on the results of XRD, the Lotgering factor F was calculated.

Next, the sintered disc-shaped tungsten bronze structure metal oxide was polished to a thickness of 1 mm.

After that, an Au electrode was formed with a thickness of 500 μm on both surfaces using a sputtering apparatus, and cut to 2.5 mm×10 mm using a cutting apparatus to obtain a piezoelectric device for evaluating electric characteristics.

The polarization treatment was performed at a temperature of 100° C. and an applied electric field of 40 kV/cm for 20 minutes. The state of polarization was checked by a resonance-antiresonance method. The piezoelectric characteristics were evaluated using a $d_{33}$ meter (Piezo Meter System produced by PIEZOTEST).

Table 1 shows the results of the composition, relative density, orientation degree, and $d_{33}$ of the obtained piezoelectric material.

Example 2

A piezoelectric material of a tungsten bronze structure metal oxide $(1-x)CBN-xBBN$ ($0 \leq x \leq 1$), in which $x=0.45$, was obtained by the same method as that of Example 1. Table 1 shows the results of the obtained piezoelectric material.

Example 3

A piezoelectric material of a tungsten bronze structure metal oxide $(1-x)CBN-xBBN$ ($0 \leq x \leq 1$), in which $x=0.60$, was obtained by the same method as that of Example 1. Table 1 shows the results of the obtained piezoelectric material.

Example 4

A piezoelectric material of a tungsten bronze structure metal oxide $(1-x)CBN-xBBN$ ($0 \leq x \leq 1$), in which $x=0.75$, was obtained by the same method as that of Example 1. Table 1 shows the results of the obtained piezoelectric material.

Example 5

A piezoelectric material of a tungsten bronze structure metal oxide $(1-x)CBN-xBBN$ ($0 \leq x \leq 1$), in which $x=0.90$, was obtained by the same method as that of Example 1. Table 1 shows the results of the obtained piezoelectric material.

Example 6

A piezoelectric material of a tungsten bronze structure metal oxide $(1-x)CBN-xBBN$ ($0 \leq x \leq 1$), in which $x=0.95$, was obtained by the same method as that of Example 1. Table 1 shows the results of the obtained piezoelectric material.

Example 7

A piezoelectric material of a tungsten bronze structure oxide $(1-x)CBN-xBBN$ ($0 \leq x \leq 1$), in which $x=0.75$, was produced. As materials, barium carbonate, calcium carbonate, bismuth oxide, and niobium oxide powders were used, and dry mixed with a mortar in a predetermined mixing ratio.

Calcination was performed by placing the mixed powder in an aluminum crucible and sintering it using an electric furnace in the atmosphere at 950° C. for 5 hours. Then, the mixed powder was crushed with a mortar and placed again in the alumina crucible, and sintered using the electric furnace in the atmosphere at 1100° C. for 5 hours.

A slurry was prepared by mixing the powder obtained by the calcination, pure water, and a dispersant in the predetermined amount is 2.0% by weight, and subjecting the mixture to dispersion treatment using a pot mill for 24 hours or longer. Here, for checking the dispersed state, a particle diameter was measured using a dynamic light-scattering photometer (Zeta Sizer produced by Sysmex Corporation). As a result of the measurement, the average of particle diameter was about 900 nm. The average of particle diameter is preferably 100 nm or more and 2 µm or less.

For magnetic field treatment, a superconducting magnet (JMTD-10T180 produced by Japan Superconductor Technology, Inc.) was used. A magnetic field of 10 T was generated by the superconducting magnet, and a table was rotated at 30 rpm in a direction perpendicular to the magnetic field direction using a non-magnetic ultrasonic motor capable of rotation driving in a magnetic field. Plaster was placed still on the table, and a slurry was flowed into the plaster to serve as a base on the table during rotation, whereby the slurry was molded by slip casting. Thus, a disc-shaped molded body was obtained.

The molded body was dried as described below. After the slip casting, the inside of the plaster was dried around the clock, and die-cutting was performed. Then, the molded body was sealed in a sealed container and heated at 45° C. for 24 hours. After that, the molded body was dried in the atmosphere for 1 week.

The surface and the face that had been in contact with the plaster of the dried molded body were removed with a #400 polishing sheet.

The molded body thus obtained was sintered using the electric furnace in the atmosphere at 1300° C. to 1350° C. for 6 hours. Here, the density of the obtained sintered body was evaluated by the Archimedes' method. Furthermore, the obtained sintered body was subjected to structure analysis by XRD (X-ray diffraction) and composition analysis by fluorescent X-ray analysis after the surface was cut.

Furthermore, in the same manner as in Example 1, the sintered disc-shaped tungsten bronze structure metal oxide was polished to a thickness of 1 mm. After that, an Au electrode was formed with a thickness of 500 µm on both surfaces using a sputtering apparatus, and cut to 2.5 mm×10 mm using a cutting apparatus to obtain a piezoelectric device for evaluating electric characteristics.

The polarization treatment was performed at a temperature of 160° C. and an applied electric field of 20 kV/cm for 10 minutes. The state of polarization was checked by a resonance-antiresonance method. The piezoelectric characteristics were evaluated using a $d_{33}$ meter (Piezo Meter System produced by PIEZOTEST).

Table 2 shows the results of the relative density, orientation degree, $d_{33}$, and sample appearance of the obtained piezoelectric material.

Example 8

A piezoelectric material of a tungsten bronze structure metal oxide (1−x)CBN–xBBN (0≤x≤1), in which x=0.75, was produced. As materials, barium carbonate, calcium carbonate, bismuth oxide, and niobium oxide powders were used, and dry mixed with a mortar in a predetermined mixing ratio.

Calcination was performed by placing the mixed powder in an aluminum crucible and sintering it using an electric furnace in the atmosphere at 950° C. for 5 hours. Then, the mixed powder was crushed with a mortar and placed again in the alumina crucible, and sintered using the electric furnace in the atmosphere at 1100° C. for 5 hours.

A slurry was prepared by mixing the powder obtained by the calcination, pure water, and a dispersant in the predetermined amount is 2.0% by weight, and subjecting the mixture to dispersion treatment using a pot mill for 24 hours or longer. Here, for checking the dispersed state, a particle diameter was measured using a dynamic light-scattering photometer (Zeta Sizer produced by Sysmex Corporation). As a result of the measurement, the average of particle diameter was about 900 nm. The average of particle diameter is preferably 100 nm or more and 2 µm or less.

For magnetic field treatment, a superconducting magnet (JMTD-10T180 produced by Japan Superconductor Technology, Inc.) was used. A magnetic field of 10 T was generated by the superconducting magnet, and a table was rotated at 30 rpm in a direction perpendicular to the magnetic field direction using a non-magnetic ultrasonic motor capable of rotation driving in a magnetic field.

First, the slurry prepared above was preliminarily flowed in a small amount to plaster to serve as a base outside a high magnetic field environment, followed by solidifying to some degree, whereby an undercoat layer was formed by slip casting.

Next, plaster having the undercoat layer was placed still on the table of the magnetic field apparatus, and a slurry was flowed to the plaster on the table during rotation, whereby molding was performed by slip casting.

Under the same condition as that in Example 7, the molded body was dried as described below. After the slip casting, the inside of the plaster was dried around the clock, and die-cutting from the plaster was performed. Then, the molded body heated in a sealed container at 45° C. for 24 hours. After that, the molded body was dried in the atmosphere for 1 week.

The surface and the undercoat layer of the dried molded body were removed with a blade saw to obtain a disk-shaped molded body.

Under the same condition as that in Example 7, the molded body thus obtained was sintered using the electric furnace in the atmosphere at 1300° C. to 1350° C. for 6 hours. Here, the density of the obtained sintered body was evaluated by the Archimedes' method. Furthermore, the obtained sintered body was subjected to structure analysis by XRD (X-ray diffraction) and composition analysis by fluorescent X-ray analysis after the surface was cut.

Furthermore, in the same manner as in Example 1, the sintered disc-shaped tungsten bronze structure metal oxide was polished to a thickness of 1 mm. After that, an Au electrode was formed with a thickness of 500 µm on both surfaces using a sputtering apparatus, and cut to 2.5 mm×10 mm using a cutting apparatus to obtain a piezoelectric device for evaluating electric characteristics.

The polarization treatment was performed at a temperature of 160° C. and an applied electric field of 20 kV/cm for 10 minutes. The state of polarization was checked by a resonance-antiresonance method. The piezoelectric characteristics were evaluated using a $d_{33}$ meter (Piezo Meter System produced by PIEZOTEST).

Table 2 shows the results of the relative density, orientation degree, $d_{33}$, and sample appearance of the obtained piezoelectric material.

Example 9

A piezoelectric material of a tungsten bronze structure oxide (1−x)CBN–xBBN (0≤x≤1), in which x=0.75, was produced. As materials, barium carbonate, calcium carbonate, bismuth oxide, and niobium oxide powders were used, and dry mixed with a mortar in a predetermined mixing ratio.

Calcination was performed by placing the mixed powder in an aluminum crucible and sintering it using an electric furnace in the atmosphere at 950° C. for 5 hours. Then, the mixed powder was crushed with a mortar and placed again in the alumina crucible, and sintered using the electric furnace in the atmosphere at 1100° C. for 5 hours.

A slurry was prepared by mixing the powder obtained by the calcination, pure water, and a dispersant in the predetermined amount is 2.0% by weight, and subjecting the mixture to dispersion treatment using a pot mill for 24 hours or longer. Here, for checking the dispersed state, a particle diameter was measured using a dynamic light-scattering photometer (Zeta Sizer produced by Sysmex Corporation). As a result of the measurement, the average of particle diameter was about 900 nm. The average of particle diameter is preferably 100 nm or more and 2 μm or less.

For magnetic field treatment, a superconducting magnet (JMTD-10T180 produced by Japan Superconductor Technology, Inc.) was used. A magnetic field of 10 T was generated by the superconducting magnet, and a table was rotated at 30 rpm in a direction perpendicular to the magnetic field direction using a non-magnetic ultrasonic motor capable of rotation driving in a magnetic field.

First, plaster to serve as a base was placed still on the table of the magnetic field apparatus, and a slurry was flowed in a small amount to the plaster on the table during rotation, followed by solidifying to some degree, whereby an undercoat layer was formed by slip casting.

Next, a slurry was flowed to plaster having the undercoat layer, whereby molding was performed by slip casting.

Under the same condition as that in Example 7, the molded body was dried as described below. After the slip casting, the inside of the plaster was dried around the clock, and die-cutting from the plaster was performed. Then, the molded body heated in a sealed container at 45° C. for 24 hours. After that, the molded body was dried in the atmosphere for 1 week.

Under the same condition as that in Example 8, the surface and the undercoat layer of the dried molded body were removed with a blade saw to obtain a disk-shaped molded body.

Under the same condition as that in Example 7, the molded body thus obtained was sintered using the electric furnace in the atmosphere at 1300° C. to 1350° C. for 6 hours. Here, the density of the obtained sintered body was evaluated by the Archimedes' method. Furthermore, the obtained sintered body was subjected to structure analysis by XRD (X-ray diffraction) and composition analysis by fluorescent X-ray analysis after the surface was cut.

Furthermore, in the same manner as in Example 1, the sintered disc-shaped tungsten bronze structure metal oxide was polished to a thickness of 1 mm. After that, an Au electrode was formed with a thickness of 500 μm on both surfaces using a sputtering apparatus, and cut to 2.5 mm×10 mm using a cutting apparatus to obtain a piezoelectric device for evaluating electric characteristics.

The polarization treatment was performed at a temperature of 160° C. and an applied electric field of 20 kV/cm for 10 minutes. The state of polarization was checked by a resonance-antiresonance method. The piezoelectric characteristics were evaluated using a $d_{33}$ meter (Piezo Meter System produced by PIEZOTEST).

Table 2 shows the results of the relative density, orientation degree, $d_{33}$, and sample appearance of the obtained piezoelectric material.

Example 10

A piezoelectric material of a tungsten bronze structure metal oxide (1−x)CBN−xBBN (0≤x≤1), in which x=0.75, was produced. As materials, barium carbonate, calcium carbonate, bismuth oxide, and niobium oxide powders were used, and dry mixed with a mortar in a predetermined mixing ratio.

Furthermore, a piezoelectric material of a tungsten bronze structure metal oxide (1−x)CBN−xBBN (0≤x≤1), in which x=0.75, with Mn added was produced. As materials, manganese oxide, barium carbonate, calcium carbonate, bismuth oxide, and niobium oxide powders were used, and dry mixed with a mortar in a predetermined mixing ratio. The amount of manganese oxide is preferably 0.1% by weight or more and 10% by weight or less in terms of metal manganese. The amount of manganese oxide is more preferably 0.3% by weight or more and 5% by weight or less in terms of metal manganese.

Calcination was performed in the same way with respect to the above-mentioned two kinds of compositions.

First, calcination was performed by placing the mixed powder in an aluminum crucible and sintering it using an electric furnace in the atmosphere at 950° C. for 5 hours. Then, the mixed powder was crushed with a mortar and placed again in the alumina crucible, and sintered using the electric furnace in the atmosphere at 1100° C. for 5 hours.

A slurry was prepared in the same way with respect to the above-mentioned two kinds of calcinated powders.

First, a slurry was prepared by mixing the powder obtained by the calcination, pure water, and a dispersant in predetermined amount is 2.0% by weight, and subjecting the mixture to dispersion treatment using a pot mill for 24 hours or longer. Here, for checking the dispersed state, a particle diameter was measured using a dynamic light-scattering photometer (Zeta Sizer produced by Sysmex Corporation). As a result of the measurement, two kinds of slurries have the average particle diameter of about 900 nm. The average particle diameter is preferably 100 nm or more and 2 μm or less.

For magnetic field treatment, a superconducting magnet (JMTD-10T180 produced by Japan Superconductor Technology, Inc.) was used. A magnetic field of 10 T was generated by the superconducting magnet, and a table was rotated at 30 rpm in a direction perpendicular to the magnetic field direction using a non-magnetic ultrasonic motor capable of rotation driving in a magnetic field.

First, the slurry prepared above, which had a composition with Mn added, was preliminarily flowed in a small amount to plaster to serve as a base outside a high magnetic field environment, followed by solidifying to some degree, whereby an undercoat layer was formed by slip casting.

Next, plaster having the undercoat layer was placed still on the table of the magnetic field apparatus, and a slurry without Mn added was flowed to the plaster on the table during rotation, whereby molding was performed by slip casting.

Under the same condition as that in Example 7, the molded body was dried as described below. After the slip casting, the inside of the plaster was dried around the clock, and die-cutting from the plaster was performed. Then, the molded body heated in a sealed container at 45° C. for 24 hours. After that, the molded body was dried in the atmosphere for 1 week.

Under the same condition as that in Example 8, the surface and the undercoat layer of the dried molded body were removed with a blade saw to obtain a disk-shaped molded body.

Under the same condition as that in Example 7, the molded body thus obtained was sintered using the electric furnace in the atmosphere at 1300° C. to 1350° C. for 6 hours. Here, the density of the obtained sintered body was evaluated by the Archimedes' method. Furthermore, the obtained sintered body was subjected to structure analysis by XRD (X-ray diffraction) and composition analysis by fluorescent X-ray analysis after the surface was cut.

Furthermore, in the same manner as in Example 1, the sintered disc-shaped tungsten bronze structure oxide was polished to a thickness of 1 mm. After that, an Au electrode was formed with a thickness of 500 μm on both surfaces using a sputtering apparatus, and cut to 2.5 mm×10 mm using a cutting apparatus to obtain a piezoelectric device for evaluating electric characteristics.

The polarization treatment was performed at a temperature of 160° C. and an applied electric field of 20 kV/cm for 10 minutes. The state of polarization was checked by a resonance-antiresonance method. The piezoelectric characteristics were evaluated using a $d_{33}$ meter (Piezo Meter System produced by PIEZOTEST).

Table 2 shows the results of the relative density, orientation degree, $d_{33}$, and sample appearance of the obtained piezoelectric material.

Example 11

A piezoelectric material of a tungsten bronze structure metal oxide $(1-x)CBN-xBBN$ ($0 \leq x \leq 1$), in which $x=0.75$, was produced. As materials, barium carbonate, calcium carbonate, bismuth oxide, and niobium oxide powders were used, and dry mixed with a mortar in a predetermined mixing ratio.

Furthermore, a piezoelectric material of a tungsten bronze structure metal oxide $(1-x)CBN-xBBN$ ($0 \leq x \leq 1$), in which $x=0.75$, with Mn added was produced. As materials, manganese oxide, barium carbonate, calcium carbonate, bismuth oxide, and niobium oxide powders were used, and dry mixed with a mortar in a predetermined mixing ratio. The amount of manganese oxide is preferably 0.1% by weight or more and 10% by weight or less in terms of metal manganese. The amount of manganese oxide is more preferably 0.3% by weight or more and 5% by weight or less in terms of metal manganese.

Calcination was performed in the same way with respect to the above-mentioned two kinds of compositions.

First, calcination was performed by placing the mixed powder in an aluminum crucible and sintering it using an electric furnace in the atmosphere at 950° C. for 5 hours. Then, the mixed powder was crushed with a mortar and placed again in the alumina crucible, and sintered using the electric furnace in the atmosphere at 1100° C. for 5 hours.

A slurry was prepared in the same way with respect to the above-mentioned two kinds of calcinated powders.

First, a slurry was prepared by mixing the powder obtained by the calcination, pure water, and a dispersant in predetermined amount is 2.0% by weight, and subjecting the mixture to dispersion treatment using a pot mill for 24 hours or longer. Here, for checking the dispersed state, a particle diameter was measured using a dynamic light-scattering photometer (Zeta Sizer produced by Sysmex Corporation). As a result of the measurement, two kinds of slurries each have the average particle diameter of 900 nm. The average particle diameter is preferably 100 nm or more and 2 μm or less.

For magnetic field treatment, a superconducting magnet (JMTD-10T180 produced by Japan Superconductor Technology, Inc.) was used. A magnetic field of 10 T was generated by the superconducting magnet, and a table was rotated at 30 rpm in a direction perpendicular to the magnetic field direction using a non-magnetic ultrasonic motor capable of rotation driving in a magnetic field.

First, plaster to serve as a base was placed still on the table of the magnetic field apparatus, and a slurry with Mn added was flowed in a small amount to the plaster on the table during rotation, followed by solidifying to some degree, whereby an undercoat layer was formed by slip casting.

Next, a slurry without Mn added was flowed to plaster having the undercoat layer, whereby molding was performed by slip casting.

Under the same condition as that in Example 7, the molded body was dried as described below. After the slip casting, the inside of the plaster was dried around the clock, and die-cutting from the plaster was performed. Then, the molded body heated in a sealed container at 45° C. for 24 hours. After that, the molded body was dried in the atmosphere for 1 week.

Under the same condition as that in Example 8, the surface and the undercoat layer of the dried molded body were removed with a blade saw to obtain a disk-shaped molded body.

Under the same condition as that in Example 7, the molded body thus obtained was sintered using the electric furnace in the atmosphere at 1300° C. to 1350° C. for 6 hours. Here, the density of the obtained sintered body was evaluated by the Archimedes' method. Furthermore, the obtained sintered body was subjected to structure analysis by XRD (X-ray diffraction) and composition analysis by fluorescent X-ray analysis after the surface was cut.

Furthermore, in the same manner as in Example 1, the sintered disc-shaped tungsten bronze structure metal oxide was polished to a thickness of 1 mm. After that, an Au electrode was formed with a thickness of 500 μm on both surfaces using a sputtering apparatus, and cut to 2.5 mm×10 mm using a cutting apparatus to obtain a piezoelectric device for evaluating electric characteristics.

The polarization treatment was performed at a temperature of 160° C. and an applied electric field of 20 kV/cm for 10 minutes. The state of polarization was checked by a resonance-antiresonance method. The piezoelectric characteristics were evaluated using a $d_{33}$ meter (Piezo Meter System produced by PIEZOTEST).

Table 2 shows the results of the relative density, orientation degree, $d_{33}$, and sample appearance of the obtained piezoelectric material.

Comparative Example 1

A piezoelectric material of CBN of a tungsten bronze structure metal oxide $(1-x)CBN-xBBN$ ($0 \leq x \leq 1$), in which $x=0$, was produced by the same method as that in Example 1. As materials, barium carbonate, calcium carbonate, and niobium oxide powders were used.

Table 1 illustrates the results of the composition, relative density, orientation degree, and $d_{33}$ of the obtained piezoelectric material.

Comparative Example 2

A piezoelectric material of a tungsten bronze structure metal oxide $(1-x)CBN-xBBN$ ($0 \leq x \leq 1$), in which $x=1.0$, was obtained by the same method as that of Example 1. Table 1 shows the results of the obtained piezoelectric material.

Comparative Example 3

A piezoelectric material of a tungsten bronze structure metal oxide $(1-x)CBN-xBBN$ ($0 \leq x \leq 1$), in which $x=0.15$, was obtained by the same method as that of Example 1. Table 1 shows the results of the composition, relative density, orientation degree, and $d_{33}$ of the obtained piezoelectric material. Furthermore, a sample for evaluating electric characteristics obtained by processing the obtained piezoelectric material had a surface with remarkable unevenness due to the abnormal grain growth during sintering.

Comparative Example 4

A piezoelectric material of a non-oriented tungsten bronze structure metal oxide $(1-x)CBN-xBBN$ ($0 \leq x \leq 1$), in which $x=0.45$, was produced. As materials, barium carbonate, calcium carbonate, bismuth oxide, and niobium oxide powders were used, and dry mixed with a mortar in a predetermined mixing ratio. The calcination, preparation of a slurry, sintering, production of a sample for evaluating electric characteristics, and polarization treatment were performed in the same way as in Example 1. In Comparative Example 4, magnetic field treatment was not performed, and for production of a molded body, a prepared slurry was flowed to plaster placed still and left for about 20 minutes.

Table 1 shows the results of the composition, relative density, orientation degree, and $d_{33}$ of the obtained piezoelectric material.

Comparative Example 5

A piezoelectric material of CBN of a non-oriented tungsten bronze structure metal oxide $(1-x)CBN-xBBN$ ($0 \leq x \leq 1$), in which $x=0$, was produced. As materials, barium carbonate, calcium carbonate, and niobium oxide powders were used, and dry mixed with a mortar in a predetermined mixing ratio. The calcination, preparation of a slurry, production of a molded body, sintering, production of a sample for evaluating electric characteristics, and polarization treatment were performed in the same way as in Comparative Example 4.

Table 1 shows the results of the composition, relative density, orientation degree, and $d_{33}$ of the obtained piezoelectric material.

Comparative Example 6

A piezoelectric material of BBN of a non-oriented tungsten bronze structure metal oxide $(1-x)CBN-xBBN$ ($0 \leq x \leq 1$), in which $x=1$, was produced. As materials, barium carbonate, bismuth oxide, and niobium oxide powders were used, and dry mixed with a mortar in a predetermined mixing ratio. The calcination, preparation of a slurry, production of a molded body, sintering, production of a sample for evaluating electric characteristics, and polarization treatment were performed in the same way as in Comparative Example 4.

Table 1 shows the results of the composition, relative density, orientation degree, and $d_{33}$ of the obtained piezoelectric material.

TABLE 1

| | Composition | | | Relative density (%) | 001 orientation degree F (%) | $d_{33}$ (pC/N) |
|---|---|---|---|---|---|---|
| | x | Ba/Nb = a | Bi/Nb = b | Ca/Nb = c | | | |
| Example 1 | 0.3 | 0.368 | 0.0207 | 0.1 | 98.9 | 58.2 | 54.1 |
| Example 2 | 0.45 | 0.364 | 0.0331 | 0.0756 | 98.2 | 47.5 | 60.4 |
| Example 3 | 0.6 | 0.374 | 0.0394 | 0.0618 | 98.4 | 35.8 | 71.5 |
| Example 4 | 0.75 | 0.398 | 0.0515 | 0.0357 | 98.4 | 66.3 | 74.7 |
| Example 5 | 0.9 | 0.396 | 0.058 | 0.0155 | 99 | 80.5 | 61.5 |
| Example 6 | 0.95 | 0.398 | 0.0633 | 0.007 | 98.1 | 60.3 | 53 |
| Comparative Example 1 | 0 | 0.378 | 0 | 0.143 | 97.8 | 24.5 | 24.4 |
| Comparative Example 2 | 1 | 0.421 | 0.0672 | 0 | 96 | 44.6 | 44.1 |
| Comparative Example 3 | 0.15 | 0.386 | 0.0126 | 0.133 | 99 | 85 | 42.7 |
| Comparative Example 4 | 0.45 | 0.397 | 0.0272 | 0.0812 | 96.2 | 0 | 27 |
| Comparative Example 5 | 0 | 0.372 | 0 | 0.129 | 94.7 | 0 | 20.6 |
| Comparative Example 6 | 1 | 0.404 | 0.0495 | 0 | 94.4 | 0 | 29.5 |

(Note)
Table 1 shows values regarding a composition including a composition ratio x, a molar amount ratio a of Ba with respect to a molar amount of Nb, a molar amount ratio b of Bi with respect to the molar amount of Nb, and a molar amount ratio c of Ca with respect to the molar amount of Nb, a relative density, a Lotgering factor F, and a piezoelectric constant $d_{33}$ in each example and comparative example from the left.

Furthermore, from the fact that in Comparative Examples 4, 5, and 6 in which magnetic field treatment was not performed, the Lotgering factor F indicating the orientation degree of C-axis orientation showed F=0, it was seen that there was no orientation.

It can be seen from Table 1 that the samples subjected to magnetic field treatment have larger piezoelectric constants $d_{33}$ and relatively high relative densities.

Figure 2:
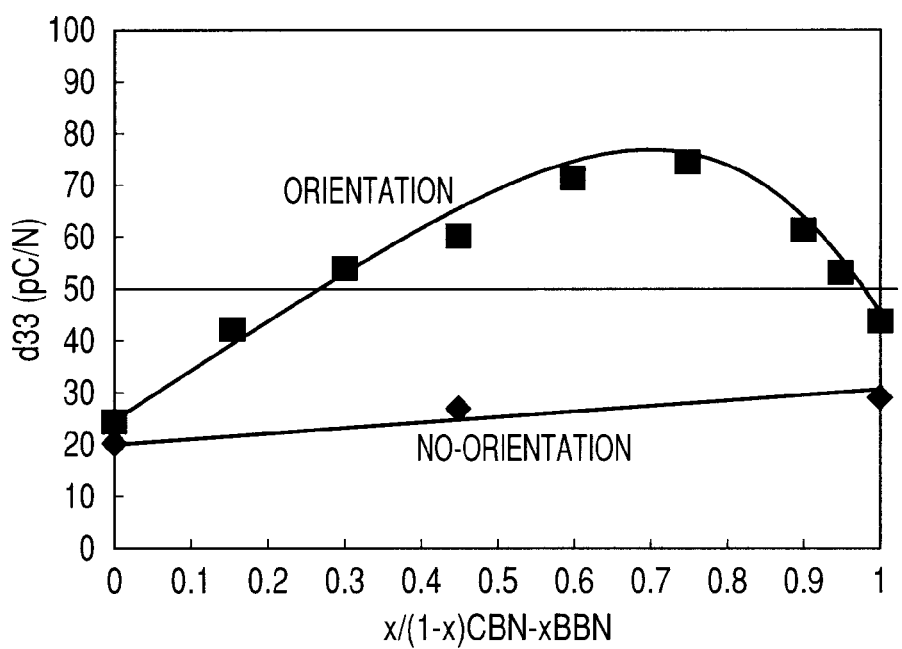
FIG. 2 is a diagram illustrating a relationship between a composition x and a piezoelectric constant $d_{33}$ of a piezoelectric material in an example of the present invention and a comparative example.

FIG. 2 illustrates a relationship between the composition ratio x and the piezoelectric constant $d_{33}$ shown in Table 1. It can be seen from the results that the piezoelectric constant $d_{33}$ of the non-oriented piezoelectric materials shown in Comparative Examples 4, 5, and 6 has a linear relationship in which the piezoelectric constant $d_{33}$ increases with respect to the composition ratio x along with the increase in the BBN component. In contrast, in the piezoelectric materials oriented in the C-axis direction in Examples 1 to 6 and Comparative Examples 1, 2, and 3, the piezoelectric constant $d_{33}$ has a non-linear relationship with the composition ratio x having an extreme value in the vicinity of 0.75. That is, the effect of enhancing the piezoelectric constant $d_{33}$ due to an orientation is larger in Examples 1 to 6 of solid solutions of CBN and BBN, compared with CBN and BBN single compositions.

Furthermore, relatively large piezoelectric characteristics are obtained even in BBN having a composition ratio x of 1.0. However, as is understood from the relative densities in Comparative Examples 1 and 6 in Table 1, the relative density is relatively low compared with the CBN-BBN shown in Examples 1 to 6, and hence, the piezoelectric materials exhibit poor piezoelectric characteristics. In addition, it is suggested that a desired output is not obtained at a time of forming a device such as an actuator, and durability that is an important requirement is poor, for example.

Furthermore, in Comparative Example 3, the piezoelectric constant $d_{33}$ is relatively large although it is smaller than that of the example, and the relative density is also as high as 99%. However, in Comparative Example 3, due to the remarkable abnormal grain growth, it is difficult to perform uniform processing since disintegration easily occurs even when polishing is performed, and hence, it is difficult to produce a device. Based on such results, the optimum composition range for providing large piezoelectric characteristics can be considered as x of 0.3 or more and 0.95 or less.

Table 2 shows the results of the relative density, orientation degree, $d_{33}$, and sample appearance of the obtained piezoelectric material.

TABLE 2

| | Relative density (%) | 001 orientation degree F. (%) | $d_{33}$ (pC/N) | Appearance |
|---|---|---|---|---|
| Example 7 | 98.7 | 81 | 88.9 | Δ |
| Example 8 | 99.2 | 89.7 | 90.2 | ○ |
| Example 9 | 99.1 | 88.9 | 86.9 | ○ |
| Example 10 | 99.1 | 86.5 | 89.8 | ○ |
| Example 11 | 99.2 | 89.2 | 87.4 | ◎ |

Note:
In Table 2, ◎ means the state in which crack is absent;
○ means the state in which crack is present but a device can be produced without any problem; and
Δ means the state in which crack is present and a device is difficult to be produced.

It can be seen from Tables 1 and 2 that the 001 orientation degree which indicates C-axis orientation is higher in the examples shown in Table 2, compared with that in the examples shown in Table 1. Due to the enhancement of the 001 orientation degree, the piezoelectric constant $d_{33}$ in the examples shown in Table 2 increases to bring about satisfactory results.

However, in Example 7 shown in Table 2, cracks are observed and it is difficult to process a device, which makes it difficult to make the evaluation. This is because, in the case of the slip casting in Example 7, a molded body obtained by drying a slurry is immobilized from a bottom surface without being oriented sufficiently under the application of a magnetic field, and consequently, the orientation is inclined from the bottom surface to the top surface. When a drying step and a sintering step are further performed while the orientation is inclined, particularly in the case of a material with high anisotropy as in a tungsten bronze structure metal oxide, a difference in contraction is large, which is likely to cause cracks.

In contrast, Examples 8, 9, 10, and 11 each have such a feature that an undercoat layer formed of a material having a composition that is the same as or different from a desired material is preliminarily formed on a base on which a slurry formed of a desired material is subjected to magnetic field treatment in a step of providing a molded body. Furthermore, preferably, Examples 8, 9, 10, and 11 each have such a feature that orientation is performed by magnetic field treatment when the undercoat layer is formed.

Thus, the undercoat layer holds a layer to be immobilized from the bottom surface without being sufficiently oriented. Furthermore, in the molded body obtained at this time, a discontinuous surface is formed at an interface between the undercoat layer and the piezoelectric material with a desired composition formed on the undercoat layer, the difference in contraction caused during the drying step, the sintering step, and the like is absorbed by the discontinuous interface, and shearing stress is concentrated. Therefore, an unwanted undercoat layer can be peeled, and hence, the piezoelectric material with a desired composition can be obtained as a molded body and a sintered body with a uniform orientation.

Consequently, particularly, in Example 11 in which Mn was added to the undercoat layer, and orientation treatment was performed, a piezoelectric material of uniform and high quality could be provided while being provided with high orientation from the vicinity of the discontinuous interface. This is because, through the addition of Mn, the oriented undercoat layer has a higher orientation degree compared with that of the undercoat layer without the addition of Mn, and hence, high orientation is obtained even in the orientation at the discontinuous interface.

The piezoelectric material of the present invention is an oriented piezoelectric material with satisfactory sintering property free of Pb that is a hazardous substance, and a water-soluble alkaline ion, and hence may be used for an ultrasonic transducer.

While the present invention has been described with reference to exemplary embodiments and the examples, it is to be understood that the invention is not limited to the disclosed exemplary embodiments and examples. It will be also appreciated that many other embodiments of the invention may be possible without departing from the spirit or scope of the invention as defined in the claims.

This application claims the benefit of Japanese Patent Application No. 2009-108378, filed Apr. 27, 2009, which is hereby incorporated by reference herein in its entirety.

The invention claimed is:

1. A compound, comprising a tungsten bronze structure metal oxide, wherein: the tungsten bronze structure metal oxide contains at least metal elements of Ba, Bi, Ca, and Nb, the metal elements satisfying the following conditions in terms of molar ratio; and has a C-axis orientation:
   Ba/Nb=a: 0.363<a<0.399;
   Bi/Nb=b: 0.0110<b<0.0650; and
   Ca/Nb=c: 0.005<c<0.105,
   wherein the tungsten bronze structure metal oxide has a Lotgering factor F, which indicates an orientation degree of a diffraction peak (001), of 0.30 to 1.00 in an X-ray diffraction method.

2. The compound according to claim 1, wherein the tungsten bronze structure metal oxide comprises $(1-x).Ca_{1.4}Ba_{3.6}Nb_{10}O_{30}-x.Ba_4Bi_{0.67}Nb_{10}O_{30}(0.30 \le x \le 0.95)$.

3. A piezoelectric material, comprising the compound according to claim 1.

4. A production method for a compound, comprising:
   (A) providing a slurry in which powder of a tungsten bronze structure metal oxide obtained by forming a solid solution of at least metal elements of Ba, Bi, Ca, and Nb is dispersed;
   (B) providing a molded body by placing the slurry on a base, orienting the slurry by subjecting the slurry to rotational magnetic field treatment, and then drying the slurry; and
   (C) sintering the molded body.

5. The production method for a compound according to claim 4, wherein a surface of the base in the (B) providing a molded body has an undercoat layer formed of a tungsten bronze structure metal oxide obtained by forming a solid solution of at least metal elements of Ba, Bi, Ca, and Nb.

6. The production method for a compound according to claim 4, wherein a surface of the base in the (B) providing a molded body has an undercoat layer formed of a tungsten bronze structure metal oxide obtained by forming a solid solution of at least metal elements of Ba, Bi, Ca, Nb, and Mn.

7. The production method for a compound according to claim 5, wherein the undercoat layer is oriented.

8. A piezoelectric element, comprising the piezoelectric material according to claim 3 sandwiched between a pair of electrodes.

9. The piezoelectric material according to claim 3, which is free from Pb.

* * * * *